United States Patent
Annunziata et al.

(10) Patent No.: US 9,515,252 B1
(45) Date of Patent: Dec. 6, 2016

(54) LOW DEGRADATION MRAM ENCAPSULATION PROCESS USING SILICON-RICH SILICON NITRIDE FILM

(71) Applicants: INTERNATIONAL BUSINESS MACHINES CORPORATION, Armonk, NY (US); Samsung Electronics Co., Ltd., Suwon-si, Gyeonggi-do (KR)

(72) Inventors: Anthony J. Annunziata, Stamford, CT (US); Chandrasekaran Kothandaraman, New York, NY (US); Gen P. Lauer, Yorktown Heights, NY (US); JungHyuk Lee, Seoul (KR); Nathan P. Marchack, White Plains, NY (US); Deborah A. Neumayer, Danbury, CT (US); Eugene J. O'Sullivan, Nyack, NY (US); Jeong-Heon Park, Seoul (SK)

(73) Assignees: INTERNATIONAL BUSINESS MACHINES CORPORATION, Armonk, NY (US); SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/983,015

(22) Filed: Dec. 29, 2015

(51) Int. Cl.
| | | |
|---|---|---|
| H01L 27/00 | (2006.01) |
| H01L 43/08 | (2006.01) |
| H01L 43/12 | (2006.01) |
| H01L 43/02 | (2006.01) |
| G11C 11/16 | (2006.01) |
| H01L 27/22 | (2006.01) |

(52) U.S. Cl.
CPC ............. *H01L 43/08* (2013.01); *G11C 11/161* (2013.01); *H01L 27/22* (2013.01); *H01L 27/222* (2013.01); *H01L 43/02* (2013.01); *H01L 43/12* (2013.01)

(58) Field of Classification Search
CPC .............................. H01L 27/222; H01L 27/22
See application file for complete search history.

(56) References Cited

U.S. PATENT DOCUMENTS

| | | | |
|---|---|---|---|
| 6,713,802 B1 | 3/2004 | Lee | |
| 6,783,995 B2 | 8/2004 | Hineman et al. | |
| 2006/0019032 A1* | 1/2006 | Wang | C23C 16/308 427/248.1 |
| 2007/0080381 A1 | 4/2007 | Chien et al. | |
| 2009/0261437 A1* | 10/2009 | Kang | H01L 43/12 257/422 |

(Continued)

OTHER PUBLICATIONS

Ando, T. et al, "Origins of Effective Work Function Roll-Off Behavior for High-k Last Replacement Metal Gate Stacks", IEEE Electron Devices Letters, Jun. 2013, pp. 729-731, vol. 34, No. 6.

(Continued)

*Primary Examiner* — Ngan Ngo
(74) *Attorney, Agent, or Firm* — Cantor Colburn LLP; Vazken Alexanian (57) ABSTRACT

A method of making a magnetic random access memory (MRAM) device comprising forming a magnetic tunnel junction on an electrode, the magnetic tunnel junction comprising a first reference layer, a free layer, and a first tunnel barrier layer; and depositing an encapsulating silicon nitride film on and along sidewalls of the magnetic tunnel junction; wherein the silicon nitride film has a N:Si ratio from 0.1 to 1. An MRAM device made by the above method is also disclosed.

20 Claims, 7 Drawing Sheets

(56) References Cited

U.S. PATENT DOCUMENTS

| | | | | |
|---|---|---|---|---|
| 2009/0286402 | A1* | 11/2009 | Xia | H01L 21/0337 |
| | | | | 438/703 |
| 2012/0299133 | A1* | 11/2012 | Son | H01L 43/08 |
| | | | | 257/421 |
| 2014/0061827 | A1 | 3/2014 | Huang et al. | |
| 2015/0069559 | A1* | 3/2015 | Tsubata | H01L 43/02 |
| | | | | 257/421 |
| 2015/0255712 | A1* | 9/2015 | Tsubata | H01L 43/12 |
| | | | | 257/295 |
| 2016/0036000 | A1* | 2/2016 | Choi | H01L 51/56 |
| | | | | 257/40 |
| 2016/0083835 | A1* | 3/2016 | Adib | C23C 16/30 |
| | | | | 428/332 |
| 2016/0133830 | A1* | 5/2016 | Tan | H01L 43/12 |
| | | | | 257/421 |

OTHER PUBLICATIONS

Ando, T., "Ultimate Scaling of High-k Gate Dielectrics: Higher-k or Interfacial Layer Scavenging?", Materials, 2012, pp. 478-500, vol. 5.

Anthony J. Annunziata, "Enhancement of Spin Transfer Torque Magnetoresistive Random Access Memory Device Using Hydrogen Plasma", U.S. Appl. No. 14/982,986, filed Dec. 29, 2015.

Anthony J. Annunziata, "Magnetic Tunnel Junction With Post-Deposition Hydrogenation", U.S. Appl. No. 14/982,967, filed Dec. 29, 2015.

Cartier, E. et al, "Fundamental Aspects of HfO-2based High-k Metal Gate Stack Reliability and Implications on tiny-Scaling", Electron Devices Meeting, Dec. 2011, pp. 18.4.1-18.4.4.

List of IBM Patents or Patents Applications Treated as Related; Date Filed: Dec. 29, 2015, pp. 1-2.

* cited by examiner

LOW DEGRADATION MRAM ENCAPSULATION PROCESS USING SILICON-RICH SILICON NITRIDE FILM

BACKGROUND

The present invention relates to spin-transfer torque magnetoresistive random access memory (STT-MRAM devices), and more specifically, to encapsulating a magnetoresistive random access memory (MRAM) device using silicon-rich silicon nitride film.

A spin-transfer torque magnetoresistive random access memory device is a type of solid state, non-volatile memory that uses tunneling magnetoresistance (TMR or MR) to store information. MRAM includes an electrically connected array of magnetoresistive memory elements, referred to as magnetic tunnel junctions (MTJs). Each magnetic tunnel junction includes a free layer and fixed/reference layer that each includes a magnetic material layer. A non-magnetic insulating tunnel barrier separates the free and fixed/reference layers. The free layer and the reference layer are magnetically de-coupled by the tunnel barrier. The free layer has a variable magnetization direction, and the reference layer has an invariable magnetization direction.

A magnetic tunnel junction stores information by switching the magnetization state of the free layer. When magnetization direction of the free layer is parallel to the magnetization direction of the reference layer, the magnetic tunnel junction is in a low resistance state. Conversely, when the magnetization direction of the free layer is antiparallel to the magnetization direction of the reference layer, the magnetic tunnel junction is in a high resistance state. The difference in resistance of the magnetic tunnel junction may be used to indicate a logical '1' or '0', thereby storing a bit of information. The TMR of a magnetic tunnel junction determines the difference in resistance between the high and low resistance states. A relatively high difference between the high and low resistance states facilitates read operations in the MRAM.

MRAM devices can be encapsulated after patterning, which may be done to protect the device. Encapsulation, which can be with materials such as silicon nitride or aluminum oxide, may be used to protect the MRAM device from damage in later processing steps.

SUMMARY

According to an embodiment of the invention, a method of making a magnetic random access memory (MRAM) device comprising forming a magnetic tunnel junction on an electrode, the magnetic tunnel junction comprising a first reference layer, a free layer, and a first tunnel barrier layer; and depositing an encapsulating silicon nitride film on and along sidewalls of the magnetic tunnel junction; wherein the silicon nitride film has a N:Si ratio from 0.1 to 1.0.

According to another embodiment of the invention, a method of making a magnetic random access memory (MRAM) device comprising forming a magnetic tunnel junction on an electrode, the magnetic tunnel junction comprising a reference layer positioned in contact with the electrode, a free layer, and a tunnel barrier layer arranged between the reference layer and the free layer; and depositing an encapsulating silicon nitride film on and along sidewalls of the magnetic tunnel junction; wherein the silicon nitride film has a N:Si ratio from 0.1 to 1.0.

According to yet another embodiment of the invention, a magnetic random access memory (MRAM) device comprising a magnetic tunnel junction on an electrode, the magnetic tunnel junction comprising a first reference layer, a free layer, and a first tunnel barrier layer; and an encapsulating silicon nitride film deposited on and along sidewalls of the magnetic tunnel junction wherein the silicon nitride film has a N:Si ratio from 0.1 to 1.0.

BRIEF DESCRIPTION OF THE DRAWINGS

The subject matter, which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-3 illustrate exemplary methods of making MRAM devices according to various embodiments, in which:

DETAILED DESCRIPTION

One challenge of integrating spin-transfer torque magnetoresistive random access memory devices into the wiring layers of silicon logic and memory chips is encapsulating the spin-transfer torque magnetoresistive random access memory device after patterning. One reason for encapsulating the spin-transfer torque magnetoresistive random access memory device is to minimize degradation of the magnetic layers and tunnel barrier layer during subsequent processing.

The encapsulation process must pass two criteria. The process should protect the device from subsequent processing, and the encapsulation process itself should not cause damage to the device. However, the second criterion may be challenging. Accordingly, there is a need for encapsulation methods that produce MRAM devices that are adequately protected, yet simultaneously retain desired electronic and physical qualities.

Another challenge of improving electronic devices is increasing memory capacity without increasing chip size. This can be accomplished by building memory storage components with more memory packed into the same space. One way to achieve that is to reduce the footprint of a unit memory cell. In STT-MRAM, the footprint of a unit memory cell is mostly determined by the size of the access transistor. The size of the access transistor is determined by the current required to program the magnetic junction. Therefore, if we can reduce the area of the magnetic junction without sacrificing other performance metrics, we can significantly reduce unit cell size and increase memory density. Unfortunately, smaller memory devices may have poorer data retention.

Data retention in MRAM devices is related to coercive field (Hc) and junction area. As a device scales to smaller dimensions, Hc tends to decrease, and at the same time the junction area is reduced as well. To achieve the required data retention at smaller dimensions would require increasing Hc. For example, if one reduces the CD of junctions from 35 nm to 25 nm, the junction area is reduced by half. In order to have similar data retention, it would require the He of the 25 nm junctions to be significantly higher than that of the 35 nm junctions.

Accordingly, various embodiments provide methods of encapsulating devices for perpendicularly magnetized spin-transfer torque magnetoresistive random access memory that uses deposited silicon nitride layers. The silicon nitride is deposited after the last magnetic tunnel junction etch patterning step. Compared to other methods, the disclosed processes improve device characteristics and reduce magnetic degradation at small device diameters (e.g., <50 nm).

It has been discovered that encapsulation of a magnetic tunnel junction stack with non-stoichiometric silicon nitride by plasma-enhanced chemical vapor deposition using the methods herein produces an MRAM device with higher coercive field than devices encapsulated by conventionally produced silicon nitride films. This higher coercive field magnetic tunnel junction can be incorporated in smaller MRAM devices, for example STT-MRAM devices, with improved data retention.

Accordingly, various embodiments provide a process for encapsulation of MRAM devices based on plasma-enhanced chemical vapor deposition of non-stoichiometric (i.e., not $Si_3N_4$) silicon nitride films at temperatures that are preferably lower than 250° C., more preferably less than 200° C. In particular, some films are Si rich, with refractive indices of at least 2.2, which is greater than the refractive index of 1.96 for stoichiometric $Si_3N_4$. Such high refractive index films may be challenging to produce at low temperatures used to minimize degradation of the MRAM device (for example, lower than 250° C.).

In one embodiment, the encapsulation process is based on plasma-enhanced chemical vapor deposition of silicon nitride films using a silane ($SiH_4$), ammonia ($NH_3$), nitrogen ($N_2$), and Argon (Ar) gas plasma. The process is used for encapsulating devices and forms a portion of a multi-step fabrication process for building spin-transfer torque magnetoresistive random access memory. Like reference numerals refer to like elements across different embodiments.

Figure 1:
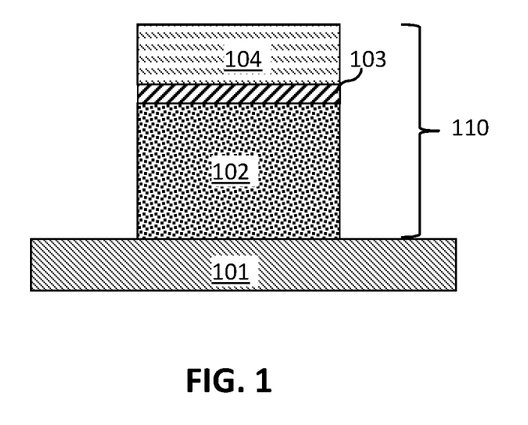
FIG. 1 is a cross-sectional side view of a patterned magnetic tunnel junction stack positioned on a contact electrode.
Figure 2:
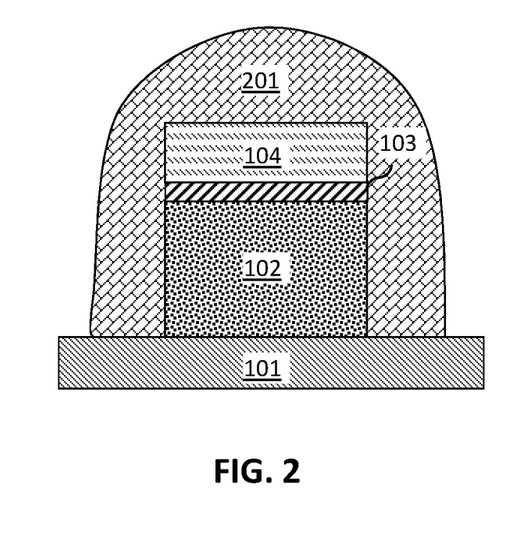
FIG. 2 is a cross-sectional side view after depositing an encapsulating film layer on the magnetic tunnel junction stack.
Figure 3:
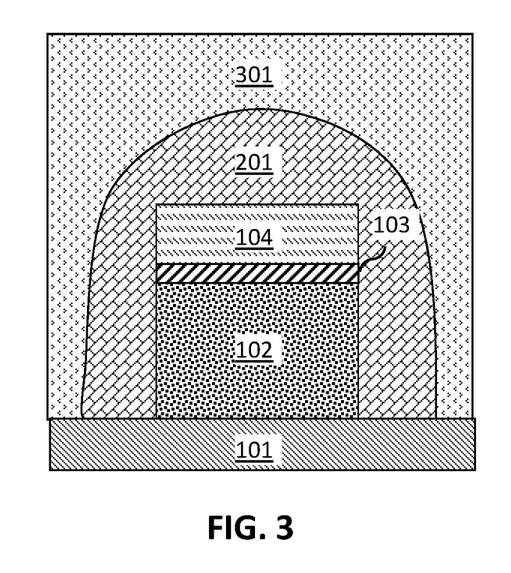
FIG. 3 is a cross-sectional side view after depositing an interlayer dielectric (ILD) layer on the encapsulating film layer.

Turning now to the Figures, FIGS. 1-3 illustrate exemplary methods of making MRAM devices according to various embodiments. FIG. 1 is a cross-sectional side view of a patterned magnetic tunnel junction stack 110 positioned on a contact electrode 101. The magnetic tunnel junction stack 110 includes a reference layer 102, a tunnel barrier layer 103, and a free layer 104.

The contact electrode 101 includes a conductive material(s) and forms the bottom contact electrode of the MRAM device. Non-limiting examples of conductive materials for the contact electrode include tantalum, tantalum nitride, titanium, or any combination thereof.

The contact electrode 101 may be formed by depositing a conductive material(s) onto a surface. The conductive material(s) may be deposited by, for example, physical vapor deposition (PVD), ion beam deposition (IBD), atomic layer deposition (ALD), electroplating, or other like processes.

To form the magnetic tunnel junction stack 110, the reference layer 102 is formed on the contact electrode 101; the tunnel barrier layer 103 is formed on the reference layer 102; and the free layer 104 is formed on the tunnel barrier layer 103.

In some embodiments, the magnetic tunnel junction stack 110 may be formed with a free layer positioned in contact with the electrode, a tunnel barrier layer arranged on the free layer, and a reference layer arranged on the tunnel barrier layer.

In some embodiments, the magnetic tunnel junction stack 110 may be formed with a first reference layer positioned in contact with the electrode, a first tunnel barrier layer arranged on the first reference layer, a free layer arranged on the first tunnel barrier layer, a second tunnel barrier layer arranged on the free layer, and a second reference layer arranged on the second tunnel barrier layer.

The reference layer 102 and the free layer 104 include conductive, magnetic materials, for example, metals or metal alloys. The reference layer 102 and the free layer 104 may be formed by employing a deposition process, for example, PVD, IBD, ALD, electroplating, or other like processes.

The reference layer 102 and the free layer 104 may include one layer or multiple layers. The reference layer 102 and the free layer 104 may include the same materials and/or layers or different materials and/or layers.

Non-limiting examples of materials for the reference layer 102 and/or the free layer 104 include iron, cobalt, boron, aluminum, nickel, silicon, oxygen, carbon, zinc, beryllium, vanadium, boron, magnesium, or any combination thereof.

The reference layer 102 has a thickness that may generally vary and is not intended to be limited. In some embodiments, the reference layer 102 has a thickness in a range from about 5 to about 25 nm. In other embodiments, the reference layer 102 has a thickness in a range from about 10 to about 15 nm.

The free layer 104 has a thickness that may generally vary and is not intended to be limited. In some embodiments, the free layer 104 has a thickness in a range from about 0.5 to about 2.5 nm. In other embodiments, the free layer 104 has a thickness in a range from about 1 to about 1.5 nm.

The tunnel barrier layer 103 includes a non-magnetic, insulating material. A non-limiting example of an insulating material for the tunnel barrier layer 103 is magnesium oxide (MgO). The tunnel barrier layer 103 may be formed on the reference layer 102 by, for example, radiofrequency (RF) sputtering in some embodiments. Alternatively, the tunnel barrier layer 103 is formed by oxidation (e.g., natural or radical oxidation) of a magnesium (Mg) layer deposited on the reference layer 102. After oxidation, the MgO layer may then be capped with a second layer of Mg. The thickness of the tunnel barrier layer 103 is not intended to be limited and may generally vary.

After depositing the magnetic tunnel junction stack 110 layers on the contact electrode 101, the magnetic tunnel junction stack 110 is patterned. In some embodiments, a hard mask material layer may be disposed on the magnetic tunnel junction stack 110. The hard mask material layer is then patterned by etching, for example, using a reactive ion etch (ME) process or a halogen-based chemical etch process (e.g., including chlorine-containing gas and/or fluorine-containing gas chemistry). The pattern from the hard mask is transferred into the free layer 104, tunnel barrier layer 103, and reference layer 101. The free layer 104, tunnel barrier layer 103, and reference layer 102 are etched by, for example, performing a MRAM stack etch process. The stack etch process may be a ME process or an ion beam etch (IBE) process.

FIG. 2 is a cross-sectional side view after depositing an encapsulating silicon nitride film 201 on the magnetic tunnel junction stack 110. The encapsulating silicon nitride film 201 encapsulates the magnetic tunnel junction stack 110. The encapsulating silicon nitride film 201 is deposited on the exposed surface and sidewalls of the magnetic tunnel junction stack 110 and contacts the contact electrode 101.

The thickness of the encapsulating silicon nitride film 201 may generally vary and is not intended to be limited. In some embodiments, the thickness of the encapsulating film 201 is in a range from about 10 to about 100 nm, or from about 20 to about 80 nm, or from about 25 to about 60 nm. To achieve a desired encapsulating layer thickness, several cycles of deposition may be performed.

In a first embodiment, the encapsulating silicon nitride film 201 includes silicon nitride and is deposited using a plasma-enhanced chemical vapor deposition method that employs a using a silane ($SiH_4$), ammonia ($NH_3$), nitrogen ($N_2$), and Argon (Ar) gas plasma.

The encapsulating silicon nitride film 201 includes $SiN_x$. Sub-stoichiometric amounts of $SiN_x$ may be formed using various amounts of nitrogen gas. The encapsulating film 201 include $SiN_x$, wherein x is the ratio of N to Si, and x may be varied to range from pure elemental Si to stoichiometric $Si_3N_4$. In one embodiment, the encapsulating layer 201 includes $SiN_x$, and x is from 0 to 1.0 (i.e., pure Si to SiN).

In some embodiments, the encapsulating silicon nitride film 201 has a ratio of N:Si of 0.1 to 1. In other embodiments, the ratio of N:Si is from 0.1 to 0.9, or From 0.1 to 0.75, or from 0.1 to 0.5, or from 0.25 to 0.5.

The plasma-enhanced chemical vapor deposition conditions for forming the encapsulating silicon nitride film 201 include low sample temperatures (e.g., preferably less than 200° C.), and low power.

High temperatures could cause damage to the device, thus the temperature used for depositing the encapsulating silicon nitride film is low to moderate. In some embodiments, depositing the encapsulating silicon nitride film is performed at a temperature in a range from about 125 to about 400° C. In other embodiments, the temperature is in a range from about 150 to about 300° C. Yet, in other embodiments, the temperature is in a range from about 150 to about 250° C. Still yet, in other embodiments, the temperature is in a range from about 150 to about 200° C.

The power used for depositing the encapsulating silicon nitride film is low. In some embodiments, the power is in a range from about 25 to about 1000 W, depending on the deposition rate and film quality and sidewall coverage. In other embodiments, the power is in a range from about 25 to about 600 W. Yet, in other embodiments, the power is in a range from about 25 to about 400 W.

In an embodiment, depositing the encapsulating silicon nitride film includes a pressure in a range from about 1 to about 8 Torr, or from about 1 to about 4 Torr, or from about 1.5 to about 2 Torr.

In an embodiment, depositing the encapsulating silicon nitride film includes a silane ($SiH_4$) flow in a range from about 30 to about 400 standard cubic centimeters per minute (sccm), or from about 50 to about 300 sccm, or from about 50 to about 200 sccm.

In an embodiment, depositing the encapsulating silicon nitride film includes an ammonia ($NH_3$) flow in a range from about 0 to about 500 standard cubic centimeters per minute (sccm), or from about 0 to about 300 sccm, or from about 0 to about 200 sccm.

In an embodiment, depositing the encapsulating silicon nitride film includes a nitrogen ($N_2$) flow in a range from about 300 to about 800 standard cubic centimeters per minute (sccm), or from about 400 to about 600 sccm, or from about 400 to about 500 sccm.

In some embodiments, exposing the magnetic tunnel junction to the deposition conditions occurs over an exposure time of from about 5 to about 200 seconds, or from about 5 to about 100 seconds, or from about 5 to about 40 seconds. Deposition time is normally determined by desired SiN thickness and deposition rate for the specific recipe.

FIG. 3 is a cross-sectional side view after depositing an interlayer dielectric (ILD) layer 301 on the magnetic tunnel junction stack 110. The ILD layer 301 may include, for example, a low-k dielectric oxide, including but not limited to, silicon dioxide, spin-on-glass, a flowable oxide, a high-density plasma oxide, or any combination thereof. The ILD layer 301 may be formed by performing deposition process, including, but not limited to plasma enhanced CVD, atomic layer deposition (ALD), evaporation, chemical solution deposition, or like processes. In some embodiments, the ILD layer 301 is deposited on the encapsulating silicon nitride film 201.

The encapsulated device is then embedded into the back-end-of-line (BEOL) of a CMOS process route. The encapsulated device may be further processed.

In some embodiments, the MRAM device as disclosed herein includes a silicon nitride film with a N:Si ratio from 0.1 to 0.75, or from 0.1 to 0.5, or from 0.25 to 0.5.

In some embodiments, the MRAM device as disclosed herein includes a silicon nitride film with a refractive index measured by ellipsometry in a range from 1.8 to 3.5, or from 2.0 to 3.2, or from 2.2 to 3.0, or from 2.3 to 2.6.

In some embodiments, the MRAM device as disclosed herein includes at least one magnetic tunnel junction with a critical dimension of less than 35 nm, said magnetic tunnel junction having a coercive field of 1000 to 4000 Oe.

In some embodiments the MRAM device made according to the methods above has a coercive field that is higher by at least 50%, 100%, 200%, or more than the coercive field of a similar device made without the methods as disclosed herein.

EXAMPLES

Example 1

Figure 4:
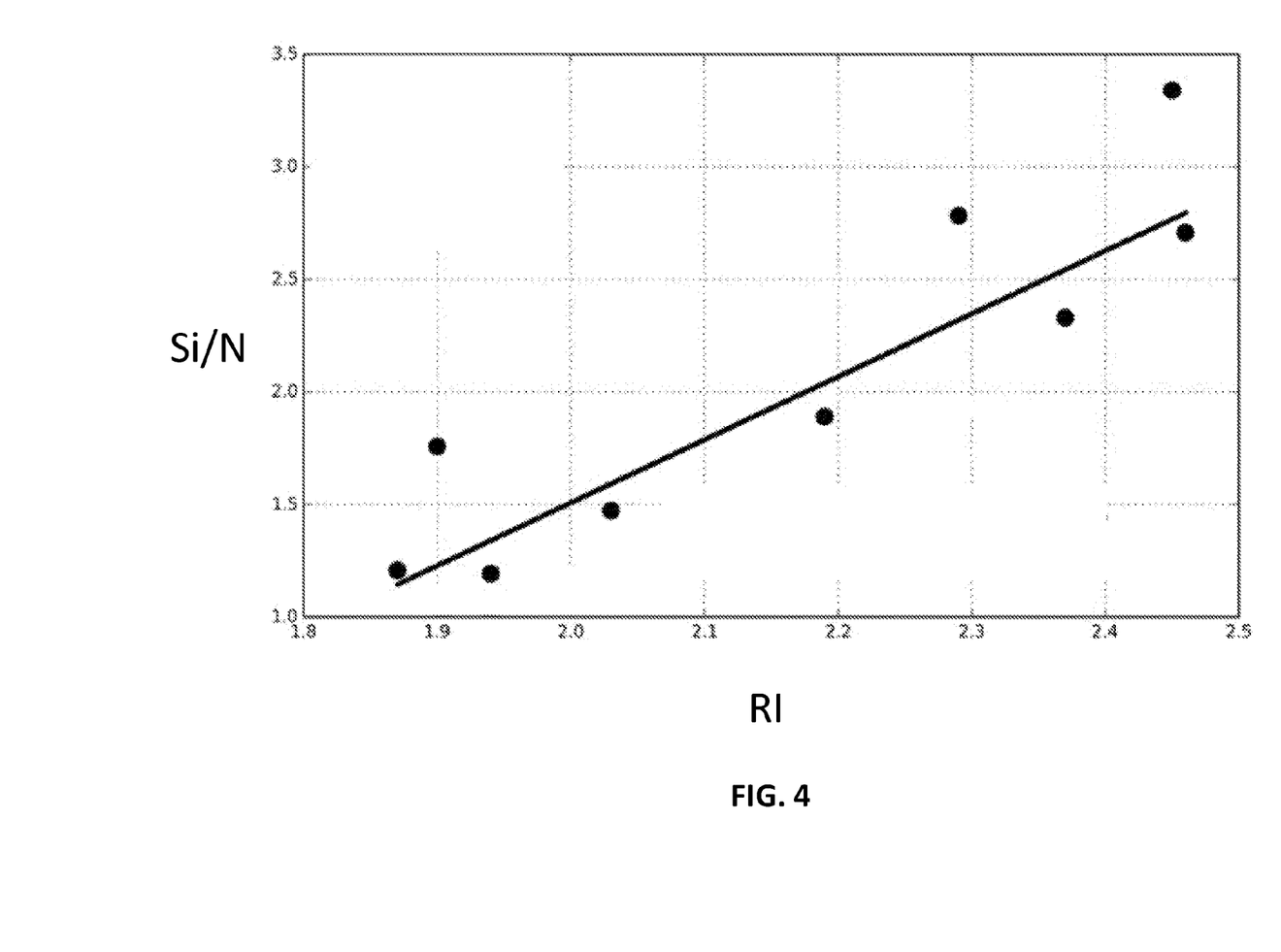
FIG. 4 is a graph illustrating Si/N ratio as a function of refractive index (RI) of the encapsulating film layer.

FIG. 4 is a graph illustrating Si/N ratio as a function of refractive index (RI) of the encapsulating silicon nitride film layer deposited using methods described herein. The graph shows the linear relationship between Si/N ratio and refractive index, such that as RI increases from about 1.85 to about 2.45, Si/N increases from about 1.2 to about 2.7, resulting in a slope of about 2.8. Thus, measurements of refractive index of a finished encapsulating silicon nitride film layer can be used to estimate the Si/N ratio in the layer.

Example 2

Figure 5:
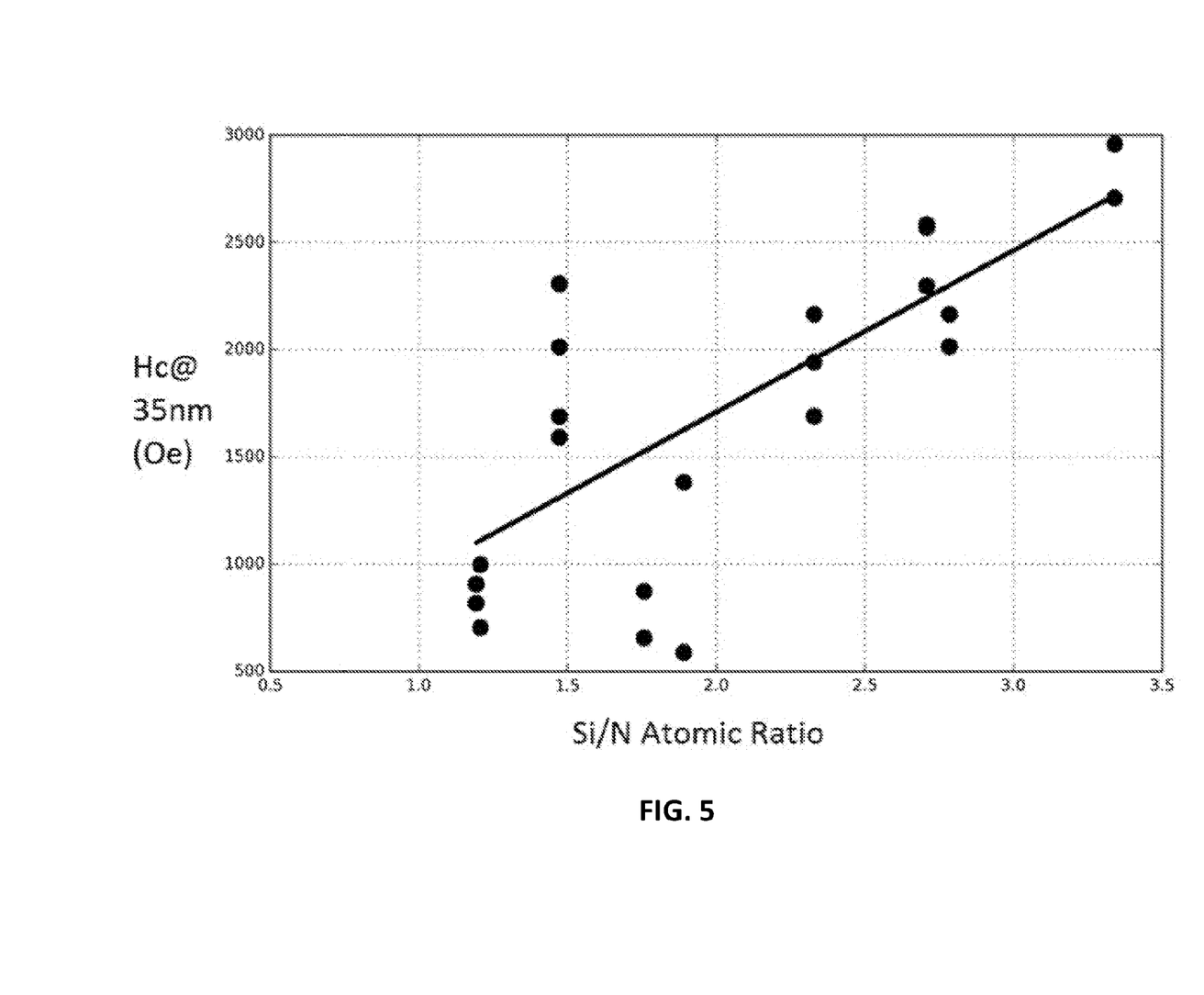
FIG. 5 is a graph illustrating MRAM coercive field as a function of Si/N ratio of the encapsulating film layer.

FIG. 5 is a graph illustrating MRAM coercivity ($H_c$) (Unit=Oested ($O_e$)) as a function of Si/N ratio of the encapsulating silicon nitride film layer made using methods as described herein. Although there is some variability, particularly at low Si/N ratios, when the Si/N ratio is above about 2.0 there is a generally linear relationship in which the coercivity increases as the Si/N ratio increases.

Example 3

Figure 6:
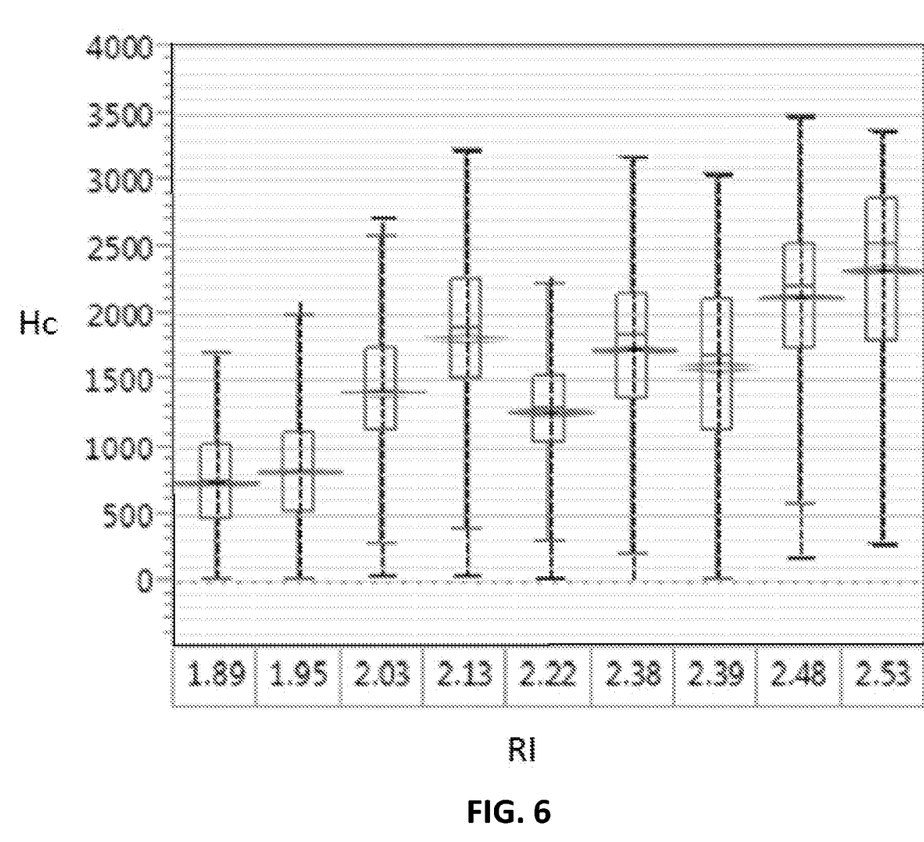
FIG. 6 is a graph illustrating MRAM device coercive field as a function of refractive index (RI) of the encapsulating film layer.

FIG. 6 is a graph illustrating MRAM device coercivity ($H_c$) ($O_e$) as a function of refractive index (RI) of the encapsulating silicon nitride film layer. In general, the higher the refractive index, the higher the coercivity. As refractive index increases with Si/N ratio (see Example 1), the devices with higher coercivity would be expected to have higher Si/N ratios.

Example 4

Figure 7:
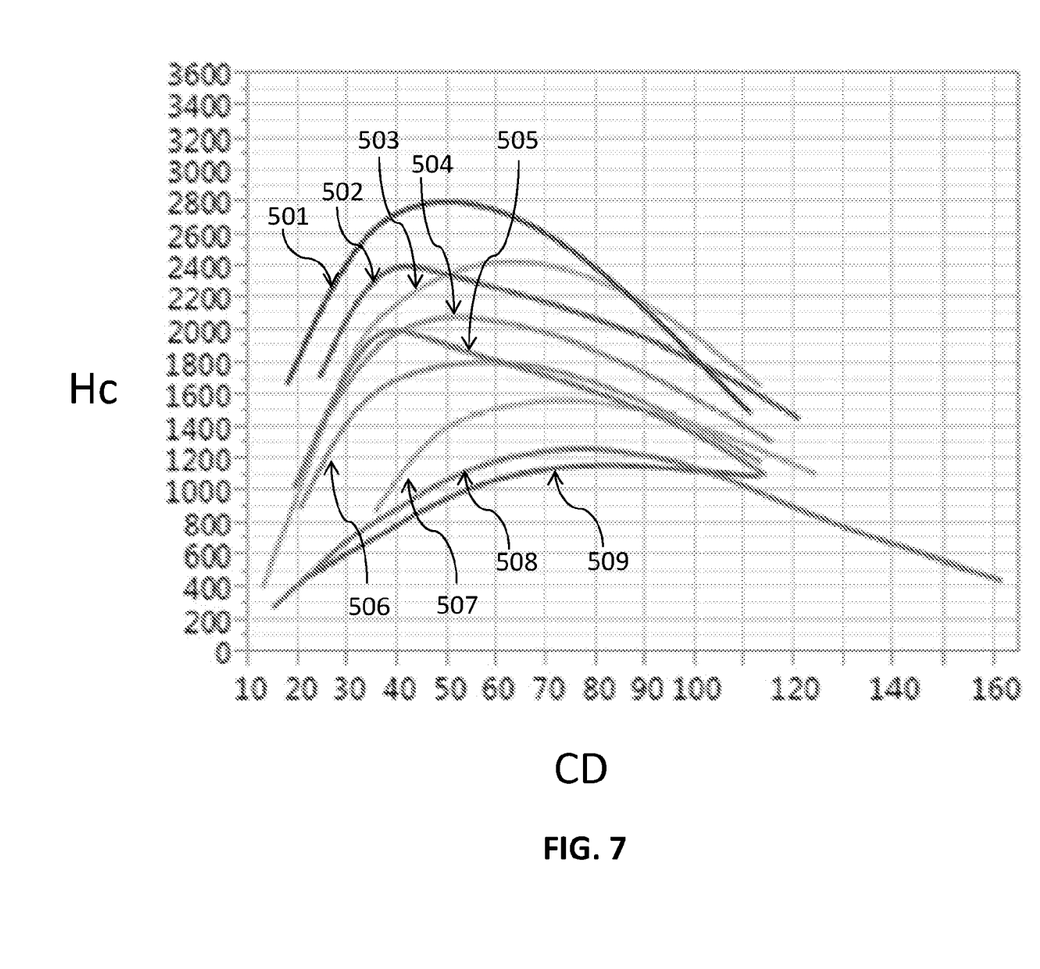
FIG. 7 is a graph illustrating MRAM device coercive field as a function of critical dimension (CD) for encapsulating film layers of varying refractive index (RI).

FIG. 7 is a graph illustrating MRAM device coercive field as a function of critical dimension (CD) (in nm, measured by transmission electron microscopy (TEM)) for encapsulating silicon nitride film layers of varying refractive index (RI).

Each trace on FIG. 7 shows coercivity versus critical dimension of a MRAM device that was made using the methods as described herein, wherein the refractive index of the encapsulating silicon nitride film layer is as given below Trace 501 is for a refractive index of 2.53.
Trace 502 is for a refractive index of 2.48.
Trace 503 is for a refractive index of 2.22.
Trace 504 is for a refractive index of 2.38.
Trace 505 is for a refractive index of 2.39.
Trace 506 is for a refractive index of 2.03.
Trace 507 is for a refractive index of 2.13.
Trace 508 is for a refractive index of 1.95.
Trace 509 is for a refractive index of 1.89

FIG. 7 shows how the general trend of increased coercivity with increased refractive index (and thus increased Si/N, see Example 1) occurs at all measured CD values from about 5 nm to about 110 nm. The proportional advantage is especially striking for CD values below about 30 nm, for which the coercivity of a device with refractive index of 2.53 can be more than 4 times greater than the coercivity of a device with refractive index of 1.89.

Example 5

Several sample silicon nitride films were made according to the methods described herein, with the films having different N/Si ratios. Table 1 shows the atomic weight % amounts of nitrogen (N), oxygen (O), and silicon (Si) in each sample, along with its N/Si ratio, the films having been produced by plasma-enhanced chemical vapor deposition with an 80 second presputter.

TABLE 1

Atomic Weight % and N/Si ratio of sample films

| Sample | N | O | Si | N/Si ratio |
| --- | --- | --- | --- | --- |
| 1 | 18.1 | 11.7 | 70.2 | 0.26 |
| 2 | 27.1 | 5.5 | 67.4 | 0.40 |
| 3 | 44.6 | 2.6 | 52.2 | 0.85 |
| 4 | 39.4 | 2.5 | 57.9 | 0.68 |
| 5 | 25.6 | 5.2 | 69.2 | 0.37 |
| 6 | 48.4 | 3.3 | 48.3 | 1.00 |

Example 6

Two MRAM devices were made with magnetic tunnel junctions with a CD of 35 nm. One device was made according to the methods described herein with the encapsulating silicon nitride film being Si-rich, with a Si/N ratio of 1.2. Another device was made in the same fashion but with the encapsulating silicon nitride film having a conventional Si/N ratio of 2.3. The conventional device had a coercivity of 700 Oe (suggesting a lower size limit of 30 nm), whereas the Si-rich device had a coercivity of 2600 Oe (suggesting a lower size limit of 15 nm or less). Thus, for devices with a small CD such as 35 nm, there is much higher coercivity when the Si-rich films are used.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making a magnetic random access memory (MRAM) device, the method comprising:
   forming a magnetic tunnel junction on an electrode, the magnetic tunnel junction comprising a first reference layer, a free layer, and a first tunnel barrier layer; and
   depositing an encapsulating silicon nitride film on and along sidewalls of the magnetic tunnel junction;
   wherein the silicon nitride film has a N:Si ratio from 0.1 to 1.

2. The method of claim 1, wherein the first reference layer is positioned in contact with the electrode, the first tunnel barrier layer is arranged on the first reference layer, and the free layer is arranged on the first tunnel barrier layer.

3. The method of claim 1, wherein the free layer is positioned in contact with the electrode, the first tunnel barrier layer is arranged on the free layer, and the first reference layer is arranged on the first tunnel barrier layer.

4. The method of claim 1, further comprising a second reference layer and second tunnel barrier layer, wherein the first reference layer is positioned in contact with the electrode, a first tunnel barrier layer is arranged on the first reference layer, a free layer is arranged on the first tunnel barrier layer, a second tunnel barrier layer is arranged on the free layer, and a second reference layer is arranged on the second tunnel barrier layer.

5. The method of claim 1, further comprising depositing an interlayer dielectric layer on the encapsulating silicon nitride film.

6. The method of claim 1, wherein the silicon nitride film has a thickness of from about 10 to about 100 nm.

7. The method of claim 1, wherein the N:Si ratio is from 0.1 to 0.75.

8. The method of claim 1, wherein the depositing of the encapsulating silicon nitride film is by plasma-enhanced chemical vapor deposition.

9. The method of claim 8, wherein depositing includes a power in a range from about 25 to about 1000 Watts (W).

10. The method of claim 8, wherein depositing is performed at a temperature in a range from about 125 to about 400° C.

11. The method of claim 8, wherein depositing includes a pressure in a range from about 1 to about 8 Torr.

12. The method of claim 8, wherein depositing includes a silane ($SiH_4$) flow in a range from about 30 to about 400 standard cubic centimeters per minute (sccm).

13. The method of claim 8, wherein depositing includes an ammonia ($NH_3$) flow in a range from about 0 to about 500 standard cubic centimeters per minute (sccm).

14. The method of claim 8, wherein depositing includes a nitrogen ($N_2$) flow in a range from about 300 to about 800 standard cubic centimeters per minute (sccm).

15. A method of making a magnetic random access memory (MRAM) device, the method comprising:

forming a magnetic tunnel junction on an electrode, the magnetic tunnel junction comprising a reference layer positioned in contact with the electrode, a free layer, and a tunnel barrier layer arranged between the reference layer and the free layer; and depositing an encapsulating silicon nitride film on and along sidewalls of the magnetic tunnel junction;

wherein the silicon nitride film has a N:Si ratio from 0.1 to 1.0.

16. The method of claim 15, wherein the depositing of the encapsulating silicon nitride film is by plasma-enhanced chemical vapor deposition.

17. A magnetic random access memory (MRAM) device, the device comprising:

a magnetic tunnel junction on an electrode, the magnetic tunnel junction comprising a first reference layer, a free layer, and a first tunnel barrier layer; and an encapsulating silicon nitride film deposited on and along sidewalls of the magnetic tunnel junction;

wherein the silicon nitride film has a N:Si ratio from 0.1 to 1.0.

18. The MRAM device of claim 17; wherein the silicon nitride film has a N:Si ratio from 0.1 to 0.9.

19. The MRAM device of claim 17, wherein the device includes at least one magnetic tunnel junction with a critical dimension of less than 35 nm, said magnetic tunnel junction having a coercive field of 1000 to 4000 Oe.

20. The MRAM device of claim 17, wherein the encapsulating silicon nitride film has a refractive index in a range from 2.0 to 3.2.

* * * * *